(12) United States Patent
Lee et al.

(10) Patent No.: US 12,051,535 B2
(45) Date of Patent: Jul. 30, 2024

(54) COIL COMPONENT

(71) Applicant: SAMSUNG ELECTRO-MECHANICS CO., LTD., Suwon-si (KR)

(72) Inventors: Dong Hwan Lee, Suwon-si (KR); Sang Soo Park, Suwon-si (KR); Dong Jin Lee, Suwon-si (KR); Chan Yoon, Suwon-si (KR); Hwi Dae Kim, Suwon-si (KR); Hye Mi Yoo, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 827 days.

(21) Appl. No.: 17/117,306

(22) Filed: Dec. 10, 2020

(65) Prior Publication Data
US 2022/0037082 A1 Feb. 3, 2022

(30) Foreign Application Priority Data
Jul. 31, 2020 (KR) .................. 10-2020-0095804

(51) Int. Cl.
*H01F 27/29* (2006.01)
*H01F 17/04* (2006.01)
*H01F 27/32* (2006.01)
*H01F 27/33* (2006.01)

(52) U.S. Cl.
CPC .......... *H01F 27/292* (2013.01); *H01F 17/04* (2013.01); *H01F 27/324* (2013.01); *H01F 27/33* (2013.01); *H01F 2017/048* (2013.01)

(58) Field of Classification Search
CPC ...... H01F 27/292; H01F 17/04; H01F 27/324; H01F 27/33; H01F 2017/048; H01F 27/34; H01F 27/345; H01F 27/348
USPC .................................. 336/221, 200
See application file for complete search history.

(56) References Cited

U.S. PATENT DOCUMENTS

| 8,344,841 | B2 * | 1/2013 | Gertenbach | H01F 27/346 |
| | | | | 336/200 |
| 9,142,342 | B2 * | 9/2015 | Haner | H01F 17/0006 |
| 9,997,290 | B2 * | 6/2018 | Gardner | H04B 1/005 |
| 11,282,634 | B2 * | 3/2022 | Kim | H01F 17/0013 |
| 2007/0183131 | A1 * | 8/2007 | Jow | H05K 1/0224 |
| | | | | 361/816 |

(Continued)

FOREIGN PATENT DOCUMENTS

| JP | 2006-54207 A | 2/2006 |
| KR | 10-2002-0019112 A | 3/2002 |

(Continued)

*Primary Examiner* — Shawki S Ismail
*Assistant Examiner* — Joselito S. Baisa
(74) *Attorney, Agent, or Firm* — MORGAN, LEWIS & BOCKIUS LLP

(57) ABSTRACT

A coil component includes a body having a core, a coil portion disposed in the body and having a central portion in which the core is disposed, a first external electrode and a second external electrode, each connected to the coil portion, a third external electrode spaced apart from each of the first and second external electrodes, and a noise removal portion disposed to at least partially surround the coil portion between a surface of the body and the core and having both end portions, each connected to the third external electrode.

21 Claims, 7 Drawing Sheets

(56) References Cited

U.S. PATENT DOCUMENTS

| | | | | |
|---|---|---|---|---|
| 2010/0182724 | A1* | 7/2010 | Ito | H03H 7/427 |
| | | | | 361/56 |
| 2016/0156326 | A1* | 6/2016 | Park | H01F 27/2823 |
| | | | | 333/185 |
| 2017/0063322 | A1 | 3/2017 | Matsunaga | |
| 2020/0082975 | A1* | 3/2020 | Yang | H01F 17/0013 |
| 2021/0358684 | A1* | 11/2021 | Yoon | H01F 41/041 |
| 2021/0366641 | A1* | 11/2021 | Kim | H01F 17/04 |

FOREIGN PATENT DOCUMENTS

| | | | |
|---|---|---|---|
| KR | 10-2017-0026135 A | | 3/2017 |
| KR | 20190135132 A | * | 12/2019 |
| WO | 01/03476 A1 | | 1/2001 |

* cited by examiner

COIL COMPONENT

CROSS-REFERENCE TO RELATED APPLICATION(S)

The present application claims the benefit of priority to Korean Patent Application No. 10-2020-0095804, filed on Jul. 31, 2020 in the Korean Intellectual Property Office, the entire disclosure of which is incorporated herein by reference.

TECHNICAL FIELD

The present disclosure relates to a coil component.

BACKGROUND

An inductor, a coil component, is a typical passive electronic component used in electronic devices, along with a resistor and a capacitor.

As electronic devices gradually gain higher levels of performance and become smaller, the number of electronic components used in electronic devices has increased while being miniaturized, and a working frequency is increased.

For this reason, there is increasing probability that an issue caused by radio-frequency (RF) noise of a coil component will occur.

SUMMARY

An aspect of the present disclosure is to provide a coil component which may easily remove radio-frequency (RF) noise.

According to an aspect of the present disclosure, a coil component includes a body having a core, a coil portion disposed in the body and having a central portion in which the core is disposed, a first external electrode and a second external electrode, each connected to the coil portion, a third external electrode spaced apart from each of the first and second external electrodes, and a noise removal portion disposed to at least partially surround the coil portion between a surface of the body and the core and having both end portions, each connected to the third external electrode.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Figure 1:
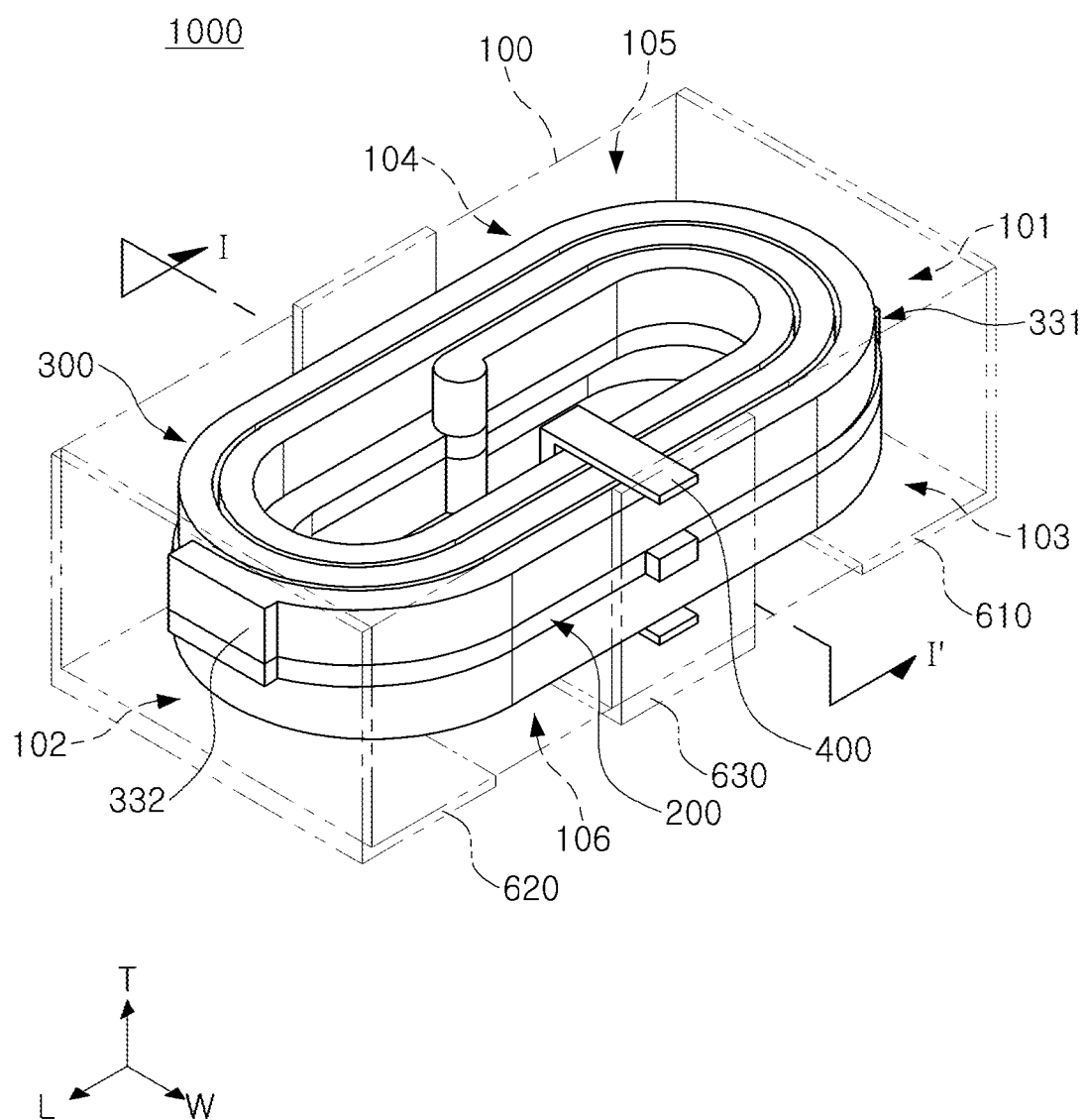
FIG. 1 is a schematic perspective view of a coil component according to a first embodiment of the present disclosure.

The terms used in the description of the present disclosure are used to describe a specific embodiment, and are not intended to limit the present disclosure. A singular term includes a plural form unless otherwise indicated. The terms "include," "comprise," "is configured to," etc. of the description of the present disclosure are used to indicate the presence of features, numbers, steps, operations, elements, parts, or combination thereof, and do not exclude the possibilities of combination or addition of one or more additional features, numbers, steps, operations, elements, parts, or combination thereof. Also, the terms "disposed on," "positioned on," and the like, may indicate that an element is positioned on or beneath an object, and does not necessarily mean that the element is positioned above the object with reference to a gravity direction.

The term "coupled to," "combined to," and the like, may not only indicate that elements are directly and physically in contact with each other, but also include the configuration in which another element is interposed between the elements such that the elements are also in contact with the other component.

Sizes and thicknesses of elements illustrated in the drawings are indicated as examples for ease of description, and the present disclosure are not limited thereto.

In the drawings, an L direction is a first direction or a length (longitudinal) direction, a W direction is a second direction or a width direction, a T direction is a third direction or a thickness direction.

Hereinafter, a coil component according to an exemplary embodiment of the present disclosure will be described in detail with reference to the accompanying drawings. Referring to the accompanying drawings, the same or corresponding components may be denoted by the same reference numerals, and overlapped descriptions will be omitted.

In electronic devices, various types of electronic components may be used, and various types of coil components may be used between the electronic components to remove noise, or for other purposes.

In other words, in electronic devices, a coil component may be used as a power inductor, a high frequency (HF) inductor, a general bead, a high frequency (GHz) bead, a common mode filter, and the like.

First Embodiment and Modified Embodiment

Figure 2:
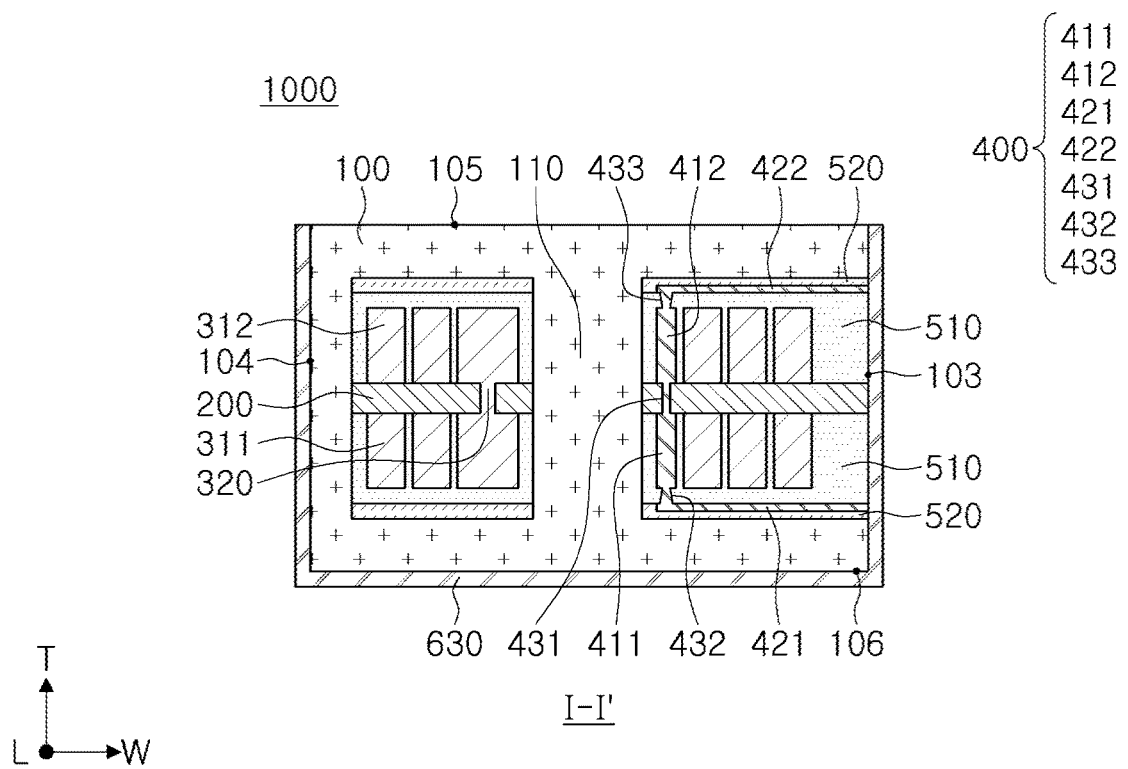
FIG. 2 is a cross-sectional view taken along line I-I' in FIG. 1.
Figure 3:
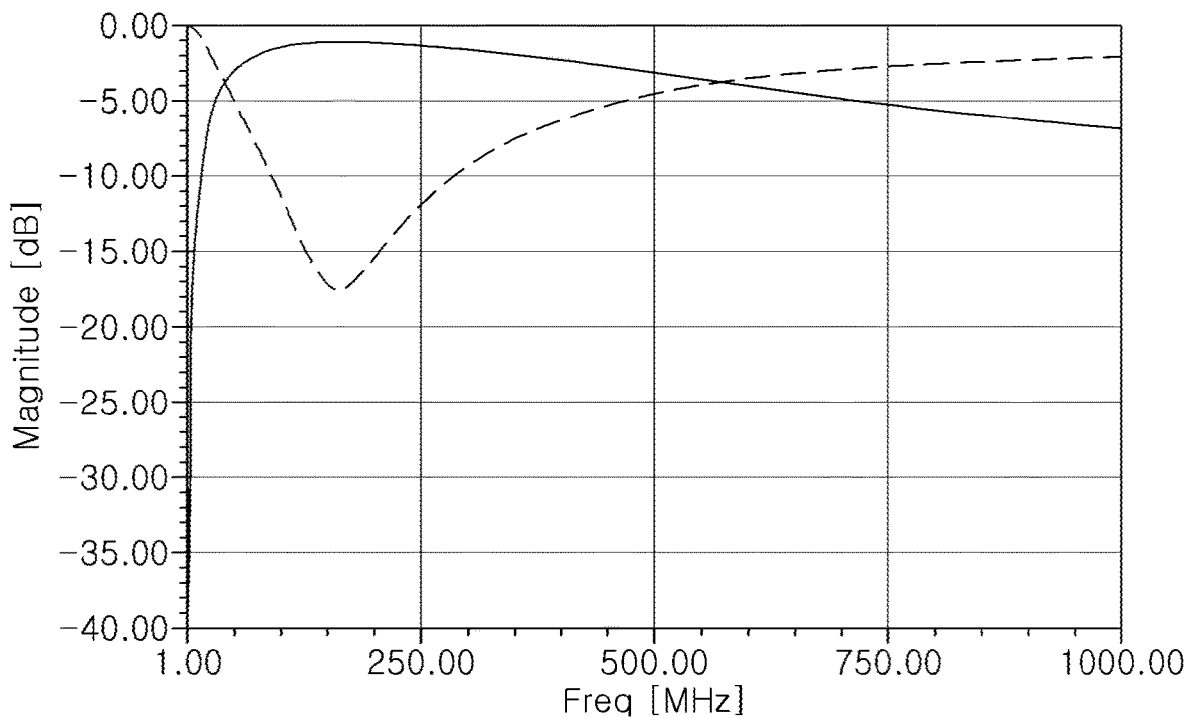
FIG. 3 is a view illustrating a signal transmission property (S-parameter) of a coil component according to the related art.
Figure 4:
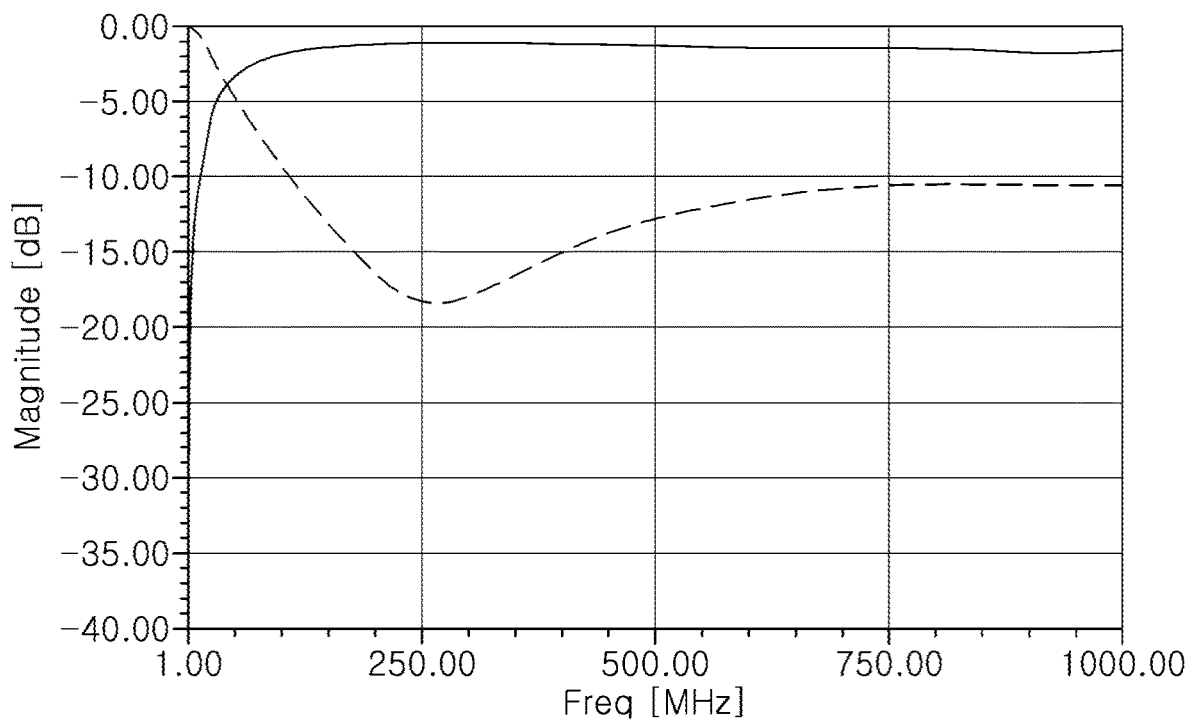
FIG. 4 is a view illustrating a signal transmission property (S-parameter) of a coil component according to the first embodiment of the present disclosure.

FIG. 1 is a schematic perspective view of a coil component according to a first embodiment of the present disclosure. FIG. 2 is a cross-sectional view taken along line I-I' in FIG. 1. FIG. 3 is a view illustrating a signal transmission property (S-parameter) of a coil component according to the related art. FIG. 4 is a view illustrating a signal transmission property (S-parameter) of a coil component according to the first embodiment of the present disclosure.

Referring to FIGS. 1 to 4, a coil component 1000 according to the first embodiment may include a body 100, a support substrate 200, a coil portion 300, a noise removal portion 400, insulating layers 510 and 520, and first, second, and third external electrodes 610, 620, and 630.

The body 100 may form an exterior of the coil component 1000 according to the present embodiment, and may embed the coil portion 300 therein.

The body 100 may be formed to have a hexahedral shape overall.

The body 100 has a first surface 101 and a second surface 102 opposing each other in a length direction L, a third surface 103 and a fourth surface 104 opposing each other in a width direction W, and a fifth surface 105 and a sixth surface 106 opposing each other in a thickness direction T, based on FIG. 1. Each of the first to fourth surfaces 101, 102, 103, and 104 of the body 100 may correspond to a wall surface of the body 100 connecting the fifth surface 101 and the sixth surface 106 of the body 100. Hereinafter, both end surfaces of the body 100 may refer to the first surface 101 and the second surface 102 of the body 100, respectively, both side surfaces of the body 100 may refer to the third surface 103 and the fourth surface 104, respectively, and one surface and the other surface of the body 100 may refer to the sixth surface 106 and the fifth surface 105 of the body 100, respectively.

As an example, the body 100 may be formed in such a manner that the coil component 1000, including the external electrodes 610, 620, and 630 to be described later, has a length of 2.0 mm, a width of 1.2 mm, and a thickness of 0.65 mm, but the present disclosure is not limited thereto. Since the above values are only values in design which do not reflect process errors, or the like, they should be regarded as belonging to the scope of the present disclosure to the extent that they can be recognized as process errors.

Each of the length, the width, and the thickness of the coil component 1000 may be measured by a micrometer measurement method. In the micrometer measurement method, measurement may be performed may be measured by setting a zero point using a micrometer (instrument) with gage repeatability and reproducibility (R&R), inserting the coil component 1000 inserted between tips of the micrometer, and turning a measurement lever of the micrometer. When the length of the coil component 1000 is measured by a micrometer measurement method, the length of the coil component 1000 may refer to a value measured once or an arithmetic mean of values measured multiple times. This may be equivalently applied to the width and the thickness of the coil component 1000.

Alternatively, each of the length, the width, and the thickness of the coil component 1000 may be measured by cross-sectional analysis. As an example, the length of the coil component 1000 may refer to a maximum value, among lengths of a plurality of segments, connecting two boundary lines opposing each other in a length (L) direction of the body 100, among outermost boundary lines of the coil component 1000 illustrated in a cross-sectional image, and parallel to the length (L) direction of the body 100, based on an optical microscope or scanning electron microscope (SEM) image for a cross section of the body 100 in a length-thickness (L-T) direction in a central portion of the body 100 in a width (W) direction. Alternatively, the length of the coil component may refer to a minimum value, among lengths of a plurality of segments connecting two boundary lines opposing each other in a length (L) direction, among outermost boundary lines of the coil component 1000 illustrated in the cross-sectional image, and parallel to the length (L) direction of the body 100. Alternatively, the length of the coil component may refer to an arithmetic mean of at least three segments, among a plurality of segments connecting two boundary lines opposing each other in a length (L) direction, among outermost boundary lines of the coil component 1000 illustrated in the cross-sectional image, and parallel to the length (L) direction of the body 100. The above description may be equivalently applied to the width and the thickness of the coil component 1000.

The body 100 may include a magnetic material and a resin. Specifically, the body 100 may be formed by laminating at least one magnetic composite sheet in which a magnetic material is dispersed in a resin. However, the body 100 may have a structure, other than the structure in which a magnetic material is dispersed in a resin. For example, the body 100 may be formed of a magnetic material such as ferrite.

The magnetic material may be ferrite or magnetic metal powder particles.

Examples of the ferrite powder particles may include at least one or more of spinel type ferrites such as Mg—Zn-based ferrite, Mn—Zn-based ferrite, Mn—Mg-based ferrite, Cu—Zn-based ferrite, Mg—Mn—Sr-based ferrite, Ni—Zn-based ferrite, and the like, hexagonal ferrites such as Ba—Zn-based ferrite, Ba—Mg-based ferrite, Ba—Ni-based ferrite, Ba—Co-based ferrite, Ba—Ni—Co-based ferrite, and the like, garnet type ferrites such as Y-based ferrite, and the like, and Li-based ferrites.

The magnetic metal powder particle may include one or more selected from the group consisting of iron (Fe), silicon (Si), chromium (Cr), cobalt (Co), molybdenum (Mo), aluminum (Al), niobium (Nb), copper (Cu), and nickel (Ni). For example, the magnetic metal powder particle may be at least one or more of a pure iron powder, a Fe—Si-based alloy powder, a Fe—Si—Al-based alloy powder, a Fe—Ni-based alloy powder, a Fe—Ni—Mo-based alloy powder, a Fe—Ni—Mo—Cu-based alloy powder, a Fe—Co-based alloy powder, a Fe—Ni—Co-based alloy powder, a Fe—Cr-based alloy powder, a Fe—Cr—Si-based alloy powder, a Fe—Si—Cu—Nb-based alloy powder, a Fe—Ni—Cr-based alloy powder, and a Fe—Cr—Al-based alloy powder.

The magnetic metal powder particle may be amorphous or crystalline. For example, the magnetic metal powder particle may be a Fe—Si—B—Cr-based amorphous alloy powder, but is not limited thereto.

Each of the magnetic metal powder particles 10 may have an average diameter of about 0.1 μm to 30 μm, but is not limited thereto. The term "average diameter" refer to an average of diameters of different particles in the magnetic metal powder. The diameters of the particles may also be characterized by a particle-size distribution expressed as D50 or D90.

The body 100 may include two or more types of magnetic metal powder particle dispersed in a resin. The term "different types of magnetic powder particle" means that the magnetic powder particles, dispersed in the resin, are distinguished from each other by at least one of average diameter, composition, crystallinity, and shape.

The resin may include epoxy, polyimide, liquid crystal polymer, or the like, in a single form or combined forms, but is not limited thereto.

The body 100 may include a core 110 penetrating through a central portion of the coil portion 300 to be described later. The core 110 may be formed by filling the central portion of the coil portion 300 with a magnetic composite sheet, but the present disclosure is not limited thereto.

The support substrate 200 may be embedded in the body 100. The support substrate 200 may support the coil portion 300 to be described later.

The support substrate 200 may include an insulating material, for example, a thermosetting insulating resin such as an epoxy resin, a thermoplastic insulating resin such as polyimide, or a photosensitive insulating resin, or the support substrate 200 may include an insulating material in which a reinforcing material such as a glass fiber or an inorganic filler is impregnated with an insulating resin. For example, the support substrate 200 may include an insulating material such as prepreg, Ajinomoto Build-up Film (ABF), FR-4, a bismaleimide triazine (BT) film, a photo-imageable dielectric (PID) film, a copper clad laminate (CCL), and the like, but are not limited thereto.

The inorganic filler may be at least one or more selected from the group consisting of silica ($SiO_2$), alumina ($Al_2O_3$), silicon carbide (SiC), barium sulfate ($BaSO_4$), talc, mud, a mica powder, aluminum hydroxide ($Al(OH)_3$), magnesium hydroxide ($Mg(OH)_2$), calcium carbonate ($CaCO_3$), magnesium carbonate ($MgCO_3$), magnesium oxide (MgO), boron nitride (BN), aluminum borate ($AlBO_3$), barium titanate ($BaTiO_3$), and calcium zirconate ($CaZrO_3$).

When the support substrate 200 is formed of an insulating material including a reinforcing material, the support substrate 200 may provide more improved rigidity. When the support substrate 200 is formed of an insulating material including no glass fiber, the support substrate 200 is advantageous for thinning the entire coil portion 300 to reduce a width of a component. When the support substrate 200 is formed of an insulating material including a photosensitive insulating resin, the number of processes for forming the coil portion 300 may be decreased. Therefore, it may be advantageous in reducing production costs, and a fine via may be formed.

The coil portion 300 may be disposed in the body 100 to express characteristics of the coil component 1000. For example, when the coil component 1000 is used as a power inductor, the coil portion 300 may be connected to each of the first and second external electrodes 610 and 620 to be described later and may store an electric field as a magnetic field to maintain an output voltage, serving to stabilize power of an electronic device.

Both end portions of the coil portion 300 are exposed to be spaced apart from each other on a surface of the body 100. Specifically, the coil portion 300 applied to the present embodiment may include a first coil pattern 311 and a second coil pattern 311 and 312, respectively formed on both surfaces of the support substrate 200 opposing each other in a thickness direction T of the body 100, and a via 320 penetrating through the support substrate 200 to connect the first and second coil patterns 311 and 312 to each other. An external end portion of the first coil pattern 311 may be exposed to the first surface 101 of the body 100 to be in contact with, and connected to, the first external electrode 610 to be described later, and an external end portion of the second coil pattern 312 may be exposed to the second surface 102 of the body 100 to be in contact with, and connected to, the second external electrode 620 to be described later. The via 320 may penetrate through the support substrate 200 to connect internal end portions of the first and second coil patterns 311 and 312 to each other.

Each of the first and second coil patterns 311 and 312 may have a shape of a planar spiral in which at least one turn is formed around the core 110. As an example, based on the directions of FIGS. 1 and 2, the first coil pattern 311 may form at least one turn around the core 110 on a lower surface of the support substrate 200, and the second coil pattern 312 may form at least one turn around the core 110 on an upper surface of the support substrate 200.

At least one of the coil patterns 311 and 312 and the via 320 may include at least one conductive layer. As an example, when the second coil pattern 312 and the via 320 are formed on a side of the other surface of the support substrate 200 by plating, each of the second coil pattern 312 and the via 320 may include a seed layer and an electroplating layer. The seed layer may be formed by vapor deposition such as electroless plating, sputtering, or the like. Each of the seed layer and the electroplating layer may have a single-layer structure or a multilayer structure. The electroplating layer having a multilayer structure may be formed to have a conformal-film structure, in which one electroplating layer covers another electroplating layer, or a structure in which one electroplating layer is laminated on only one surface of another electroplating layer. The seed layer of the second coil pattern 312 and the seed layer of the via 320 may be integrally formed, such that a boundary therebetween may not be formed, but the present disclosure is not limited thereto. The electroplating layer of the second coil pattern 312 and the electroplating layer of the via 320 may be integrally formed, such that a boundary therebetween may not be formed, but the present disclosure is not limited thereto.

As an example, based on the directions of FIGS. 1 and 2, the coil patterns 311 and 312 may be formed to protrude from the lower and upper surfaces of the support substrate 200, respectively. As another example, based on the directions of FIGS. 1 and 2, the first coil pattern 311 may be formed to protrude from the lower surface of the support substrate 200, and the second coil pattern 312 may be embedded in the upper surface of the support substrate and a lower surface of the second coil pattern 312 may be exposed to the upper surface of the support substrate 200. In this case, a concave portion may be formed on a lower surface of the second coil pattern 312, so that the upper surface of the support substrate 200 and the lower surface of the second coil pattern 312 may not be coplanar with each other. As another example, based on the directions of FIGS. 1 and 2, the second coil pattern 312 may be formed to protrude from the upper surface of the support substrate 200, and the first coil pattern 311 may be embedded in the lower surface of the support substrate 200 and an upper surface of the first coil pattern 311 may be exposed to the lower surface of the support substrate 200. In this case, a concave portion may be formed on an upper surface of the first coil pattern 311, so that the lower surface of the support substrate 200 and the upper surface of the first coil pattern 311 may not be coplanar with each other. As another example, based on the directions of FIGS. 1 and 2, the first coil pattern 311 and a first lead-out portion 331, disposed on a side of the lower surface of the support substrate 200, and the second coil pattern 312 and a second lead-out portion 332, disposed on a side of the upper surface of the support substrate 200, may be separately formed and then laminated in batch. In this case, the via 320 may include a high-melting-point metal layer and a low-melting-point metal layer having a lower melting point than the high-melting-point metal layer. The low-melting-point metal layer may be formed of a solder including lead (Pb) and/or tin (Sn). At least a portion of the low-melting-point metal layer may be melted due to a pressure and a temperature during the lamination in batch. Accordingly, an intermetallic compound (IMC) layer may be formed on at least a portion of a boundary between the low-melting-point metal layer and the second coil pattern 312 and a boundary between the low-melting-point metal layer and the high-melting-point metal layer.

Each of the coil patterns 311 and 312 and the via 320 may include a conductive material such as copper (Cu), aluminum (Al), silver (Ag), tin (Sn), gold (Au), nickel (Ni), lead (Pb), titanium (Ti), chromium (Cr), or alloys thereof, but the conductive material is not limited thereto.

The internal insulating layer 510 may be disposed between the coil portion 300 and the body 100 to prevent short-circuit between the coil portion 300 and the body 100. The internal insulating layer 510 may be disposed on both surfaces of the support substrate 200 to cover the first and second coil patterns 311 and 312. In addition, the internal insulating layer 510 may be disposed between the coil portion 300 and the noise removal portion 400 to be described later to prevent short-circuit between the coil portion 300 and the noise removal portion 400. Specifically, the internal insulating layer 510 according to the present embodiment may cover a space between adjacent turns of each of the first and second coil patterns 311 and 312, a space between an innermost turn of each of the first and second coil patterns 311 and 312 and each of first and second vertical patterns 411 and 412 of the noise removal portion 400 to be described later, an external side surface of an outermost turn of each of the first and second coil patterns 311 and 312, an upper surface the second coil 312 and a lower surface of the first coil pattern 311.

The internal insulating layer 510 may be formed by laminating an insulating film on both surface of the support substrate 200 on which the coil portion 300 and the first and second vertical patterns 411 and 412 of the noise removal portion 400 to be described later. The insulating film may be a conventional non-photosensitive insulating film such as Ajinomoto Build-up Film (ABF) or a prepreg, or may be a photosensitive insulating film such as a dry film or a photoimageable dielectric (PID) film. Alternatively, the internal insulating layer 510 may be formed by applying an insulating paste to both surface of the support substrate 200 and curing the applied insulating paste. Alternatively, the internal insulating layer 510 may be formed by forming an insulating material, such as parylene, on both surfaces of the support substrate 200 using vapor deposition.

The upper insulating layer 520 may be disposed between horizontal patterns 421 and 422 of the noise removal portion 400 to be described later and the body 100 to cover the horizontal patterns 421 and 422 and to prevent short-circuit between the horizontal patterns 421 and 422 and the body 100.

A side surface of the upper insulating layer 520 may be disposed on the same level as the side surface of the support substrate 200 adjacent to the core 110. In the present embodiment, the upper insulating layer 520 may be formed on the support substrate 200 before performing a trimming process in which the support substrate 200 is processed to have a shape corresponding to a shape of the coil portion 300. Accordingly, the shape of the upper insulating layer 520 may correspond to the shape of the support substrate 200, and the side surface of the upper insulating layer 520 may be disposed on the same level as a side surface of the support substrate 200 adjacent to the core 110.

The upper insulating layer 520 may be formed by laminating an insulating film on both surfaces of the support substrate 200 on which the horizontal patterns 421 and 422 of the noise removal portion 400 to described later are formed. The insulating film may be a conventional non-photosensitive insulating film such as Ajinomoto Build-up Film (ABF) or a prepreg, or may be a photosensitive insulating film such as a dry film or a photoimageable dielectric (PID) film. Alternatively, the internal insulating layer 510 may be formed by applying an insulating paste to both surfaces of the support substrate 200 and curing the applied insulating paste. Alternatively, the internal insulating layer 510 may be formed by forming an insulating material, such as parylene, on both surfaces of the support substrate 200 using vapor deposition.

Each of the first and second external electrodes 610 and 620 may be connected to the coil portion 300. In the present embodiment, the first external electrode 610 may be disposed on the first surface 101 of the body 100 to be connected to be in contact with, and connected to, an external end portion or lead-out portion 331 of the coil pattern 311 exposed to the first surface 101 of the body 100 and to extend upwardly of a portion of the sixth surface 106 of the body 100. The second external electrode 620 may be disposed on the second surface 102 of the body 100 to be in contact with, and connected to, an external end portion or lead-out portion 332 of the second coil pattern 312 exposed to the second surface 102 of the body 100 and to extend upwardly of a portion of the sixth surface 106 of the body 100. The first and second external electrodes 610 and 620 may be disposed to be spaced apart from each other on the sixth surface 106 of the body 100. When the coil component 1000 according to the present embodiment is mounted on a mounting board, the first and second external electrodes 610 and 620 may be signal transmission paths between the mounting board and the coil component 1000.

A third external electrode 630 may be disposed on the surface of the body 100 to be spaced apart from the first and second external electrodes 610 and 620. When the coil component 1000 according to the present embodiment is mounted on the mounting substrate, the third external electrode 630 may be connected to a ground of the mounting substrate. Alternatively, when the coil component 1000 according to the present embodiment is packaged in an electronic component package, the third external electrode 630 may be connected to a ground of the electronic component package. The third external electrode 630 may be a ground electrode of the coil component 1000 according to the present embodiment. In the present embodiment, the third external electrode 630 may have a U-shape continuously formed on the third, fourth, and sixth surfaces 103, 104, and 106, but the scope of the present disclosure is limited thereto. The third external electrodes 630 may be connected to both end portions of the noise removal portion 400 to be described later.

Each of the first to third external electrodes 610, 620, and 630 may include at least one of a conductive resin layer and an electroplating layer. The conductive resin layer may be formed by printing a conductive paste on the surface of the body 100 and curing the printed conductive paste, and may include at least one conductive metal, selected from the group consisting of copper (Cu), nickel (Ni), and silver (Ag), and a thermosetting resin. The electroplating layer may include at least one selected from the group consisting of nickel (Ni), copper (Cu), and tin (Sn).

The noise removal portion 400 may be disposed between the surface of the body 100 and the core 110 to at least partially surround the coil portion 300 and may have both ends, each connected to the third external electrode 630. For example, referring to FIGS. 1 and 2, the noise removal portion 400 applied to the present embodiment may at least partially surround all turns of the coil portion 300 between the third surface 103 of the body 100 and the core 110, and may form a closed-loop surrounding the coil portion 300 together with the third external electrode 630. The noise removal portion 400 may remove radio-frequency (RF)

noise transferred to the coil component 1000 according to the present embodiment and/or RF noise generated in the coil component 1000 according to the present embodiment. This will be described later.

The noise removal portion 400 may include a first vertical pattern 411 and a second vertical pattern 412 disposed on one surface and the other surface of the support substrate 200 to be closer to the core 110 than to an innermost turn of each of the first and second coil patterns 311 and 312, a first horizontal pattern 421 at least partially surrounding the first coil pattern 311 and connected to each of the first vertical pattern 411 and the third external electrode 630, a second horizontal pattern 422 at least partially surrounding the second coil pattern 312 and connected to each of the second vertical pattern 412 and the third external electrode 630, a first connection via 431 penetrating through the support substrate 200 to connect the first and second vertical patterns 411 and 412 to each other, a second connection via 432 penetrating through the internal insulating layer 510 to connect the first horizontal pattern 421 and the first vertical pattern 411 to each other, and a third connection via penetrating through the internal insulating layer 510 to connect the second horizontal pattern 422 and the second vertical pattern 412 to each other. Therefore, the noise removal portion 400 may at least partially surround all turns of the coil portion 300 and may form a closed-loop surrounding the coil portion 300 together with the third external electrode 630.

The first connection via 431 may be formed together with the via 320 of the coil portion 300 in the same process. The first and second vertical patterns 411 and 412 may be formed together with the first and second coil patterns 311 and 312 of the coil portion 300 in the same process. The second connection via 432 may be formed by forming an opening in the internal insulating layer 510 to expose an upper surface of the first vertical pattern 411 and filling the opening with a conductive material. The third connection via 433 may be formed by forming an opening in the internal insulating layer 510 to expose an upper surface of the second vertical pattern 412 and filling the opening with a conductive material. The first horizontal pattern 421 and the second horizontal pattern 422 may be formed by selectively forming a conductive material on the internal insulating layer 510, or by forming a conductive layer on the internal insulating layer 510 and selectively removing the conductive layer.

At least one of the vertical patterns 411 and 412, the horizontal patterns 421 and 422, and the connection vias 431, 432, and 433 may include a conductive multilayer structure. For example, when the second horizontal pattern 422 and the third connection via 432 are formed by plating, each of the second horizontal pattern 422 and the third connection via 432 may include a seed layer and an electroplating layer. The seed layer may be formed by vapor deposition such as electroless plating, sputtering, or the like. Each of the seed layer and the electroplating layer may have a single-layer structure or a multilayer structure. The electroplating layer having a multilayer structure may be formed to have a conformal-film structure, in which one electroplating layer covers another electroplating layer, or a structure in which one electroplating layer is laminated on only one surface of another electroplating layer. The seed layer of the second coil pattern 422 and the seed layer of the third connection via 432 may be integrally formed, such that a boundary therebetween may not be formed, but the present disclosure is not limited thereto.

Each of the vertical patterns 411 and 412, the horizontal patterns 421 and 422, and the connection vias 431 432, and 433 may include a conductive material copper (Cu), aluminum (Al), silver (Ag), tin (Sn), gold (Au), nickel (Ni), lead (Pb), titanium (Ti), chromium (Cr), or alloys thereof, but the conductive material is not limited thereto.

FIG. 3 illustrates a signal transmission property (S-parameter) as a function of frequency for a coil component according to the related art in which a noise removal portion 400 according to the present embodiment is not formed. FIG. 4 illustrates a signal transmission property (S-parameter) as a function of frequency for a coil component according to the first embodiment of the present disclosure. In each of FIGS. 3 and 4, a solid line represents an input reflection coefficient, for example, S11, and a dotted line represents a transmission coefficient from an input terminal to an output terminal, for example, S21.

Table 1 illustrates the summary of S21 for respective frequencies (600 MHz and 900 MHz) in each of FIGS. 3 and 4.

TABLE 1

|  | $S_{21}$ at 600 MHz(dB) | $S_{21}$ at 900 MHz(dB) |
|---|---|---|
| Comparative Embodiment | −3.59 | −2.2 |
| Present Embodiment | −11.54 | −10.54 |

The coil component according to the related art, in which the noise removal portion 400 is not formed, may allow direct current to a relatively low-frequency signal to pass well, but a noise removal effect may be rapidly deteriorated at a self-resonance frequency (SRF) or higher. Meanwhile, referring to FIG. 4, the coil component 1000 according to the present embodiment may effectively suppress noise of an unnecessary radio frequency while allowing direct current to a relatively low-frequency signal to pass well, similarly to the coil component according to the related art. In the present embodiment, since the noise removal portion 400 and the third external electrode 630 form a closed-loop, surrounding the coil portion 300, to be inductively coupled to the coil portion 300, the RF noise may relatively easily removed.

The term "radio-frequency (RF) noise" may refer to a signal having a frequency higher than an upper limit of a frequency range set as a working frequency when the coil component 1000 according to the present embodiment is designed. As a non-limiting example, in the present embodiment, radio-frequency (RF) noise may refer to a signal having a frequency of 600 MHz or higher.

Figure 5:
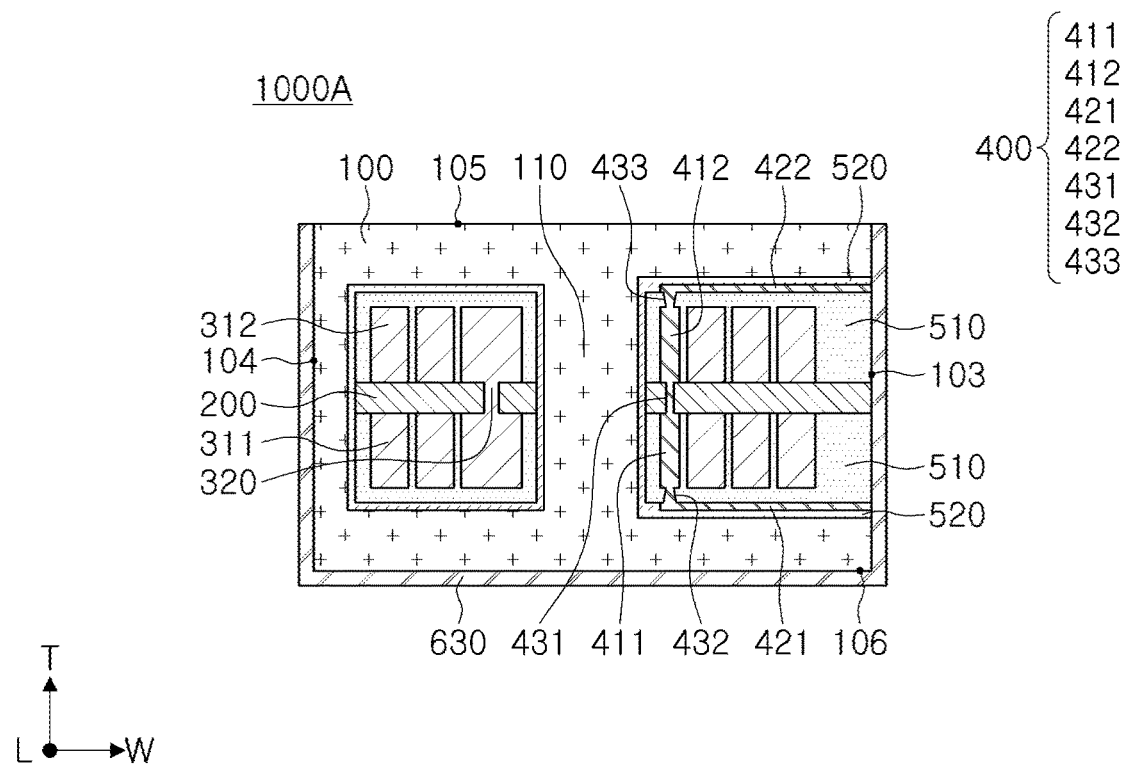
FIG. 5 is a schematic view illustrating a first modified embodiment of the first embodiment of the present disclosure, and corresponds to FIG. 2.
Figure 6:
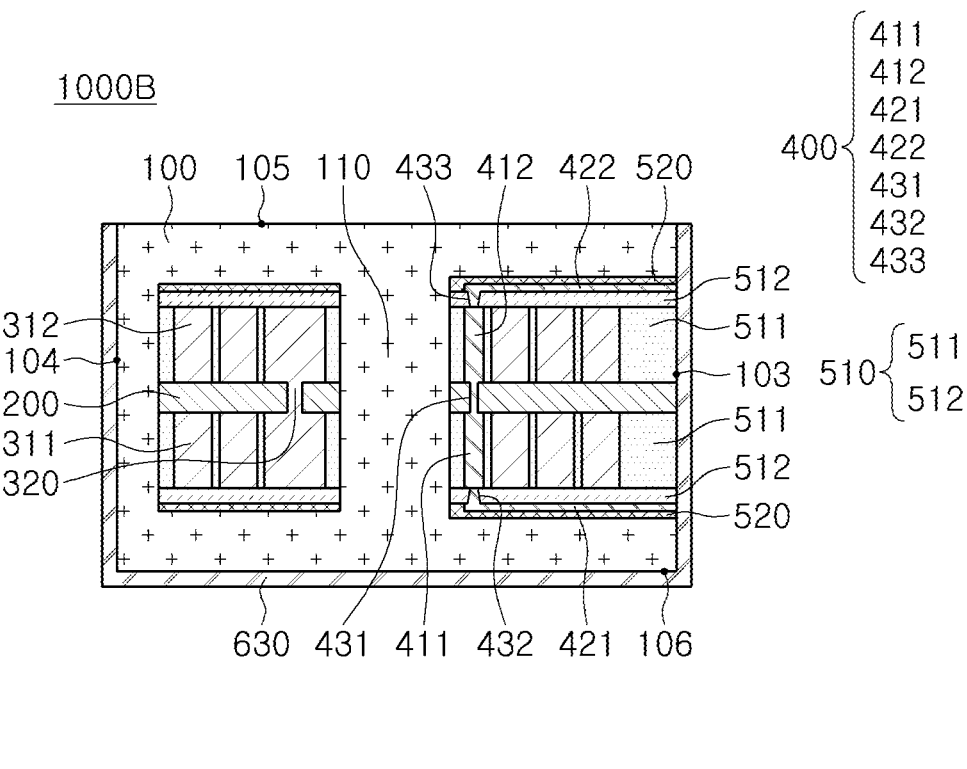
FIG. 6 is a schematic view illustrating a second modified embodiment of the first embodiment of the present disclosure, and corresponds to FIG. 2.
Figure 7:
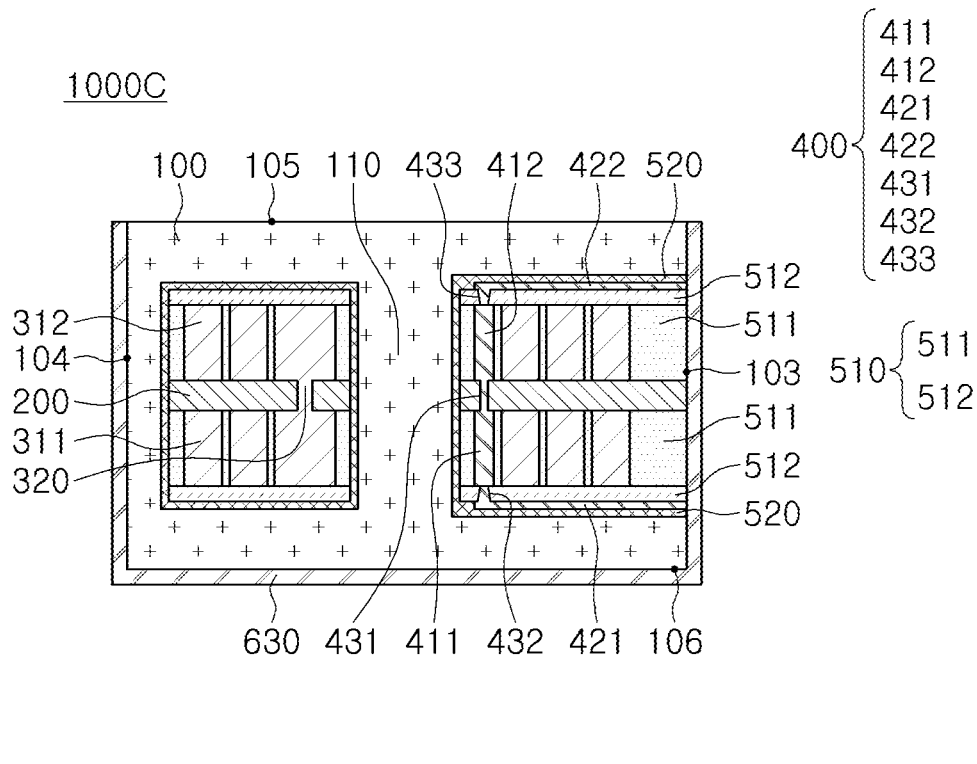
FIG. 7 is a schematic view illustrating a third modified embodiment of the first embodiment of the present disclosure, and corresponds to FIG. 2.

FIG. 5 is a schematic view illustrating a first modified embodiment of the first embodiment of the present disclosure, and corresponds to FIG. 2. FIG. 6 is a schematic view illustrating a second modified embodiment of the first embodiment of the present disclosure, and corresponds to FIG. 2. FIG. 7 is a schematic view illustrating a third modified embodiment of the first embodiment of the present disclosure, and corresponds to FIG. 2.

Referring to FIG. 5, in a coil component 1000A according to the first modified embodiment of the first embodiment, an upper insulating layer 520 may be disposed between each of an internal insulating layer 510 and a support substrate 200 and a core 110 and between each of the internal insulating layer 510 and the support substrate 200 and each of third and fourth surfaces 103 and 104 of the body 100. For example, the upper insulating layer 520 may be formed to surround all side surfaces of the internal insulating layer 510 and all side surfaces of the support substrate 200. In this modified embodiment, the upper insulating layer 520 may be formed after forming a coil portion 300, the internal insulating layer 510, and a noise removal portion 400 on the support substrate 200 and then processing the support substrate 200 and the internal insulating layer 510 using laser processing, or the like, to have a shape corresponding to a shape of the coil portion 300.

Referring to FIG. 6, in a coil component 1000B according to the second modified embodiment of the first embodiment, an internal insulating layer 510 may include a first internal insulating layer 511 and a second internal insulating layer 512. The first internal insulating layer 511 may cover a space between adjacent turns of each of first and second coil patterns 311 and 312, a space between an innermost turn of each of the first and second coil patterns 311 and 312 and each of first and second vertical patterns 411 and 412, and an internal side surface of an outermost turn of each of the first and second coil patterns 311 and 312. The second internal insulating layer 512 may be disposed on the first internal insulating layer 511, each of the first and second coil patterns 311 and 312, and each of the first and second vertical patterns 411 and 412 to cover an upper surface of each of the first and second coil patterns 311 and 312 and an upper surface of each of the first and second vertical patterns 411 and 412. In this modified embodiment, the first internal insulating layer 511 may be used as a plating resist when the coil patterns 311 and 312 and the vertical patterns 411 and 412 are formed by plating, but the scope of the present disclosure is not limited thereto. In FIG. 6, an upper surface of each of the first and second coil patterns 311 and 312, an upper surface of each of the first and second vertical patterns 411 and 412, and an upper surface of the first internal insulating layer 511 are illustrated as being disposed on the same level, but this is only an example. For example, unlike what is illustrated in FIG. 6, the upper surface of each of the first and second coil patterns 311 and 312 and the upper surface of each of the first and second vertical patterns 411 and 412 may be disposed on a lower level than the upper surface of the first internal insulating layer 511.

Referring to FIG. 7, in a coil component 1000C according to the third modified embodiment of the first embodiment, an upper insulating layer 520 may be disposed between each of an internal insulating layer 510 and a support substrate 200 and a core 110 and between each of the internal insulating layer 510 and the support substrate 200 and each of third and fourth surfaces 103 and 104 of the body 100. For example, the upper insulating layer 520 may be formed to surround all side surfaces of the internal insulating layer 510 and all side surfaces of the support substrate 200. In this modified embodiment, the upper insulating layer 520 may be formed after forming a coil portion 300, the internal insulating layer 510, and a noise removal portion 400 on the support substrate 200 and then processing the support substrate 200 and the internal insulating layer 510 using laser, or the like, to have a shape corresponding to a shape of the coil portion 300.

While each of the first and second external electrodes 610 and 620 has been described as having an L shape, the scope of the present embodiment is not limited thereto. For example, the first and second external electrodes 610 and 620 may have any shape as long as they are disposed to be spaced apart from each other on a sixth surface 106 of the body 100. As an example, the first external electrode 610 may have a modified shape such as a shape in which it is disposed on only the sixth surface 106 of the body 100, a shape in which it is disposed on a first surface 101 of the body 100 to extend to at least a portion of each of fifth and sixth surfaces 105 and 106 of the body 100, a shape in which it is disposed on the first surface 101 of the body 100 to extend to a portion of each of third to sixth surfaces 103, 104, 105, and 106 of the body, or the like.

In addition, although not illustrated in the drawing, the coil component 1000 according to the present embodiment may further include a surface insulating layer disposed on a surface of the body 100 and exposing regions, in which the sixth surface 106 of the body 100 is disposed, of at least external electrodes 610, 620, and 630.

Second, Third, and Fourth Embodiments

Figure 8:
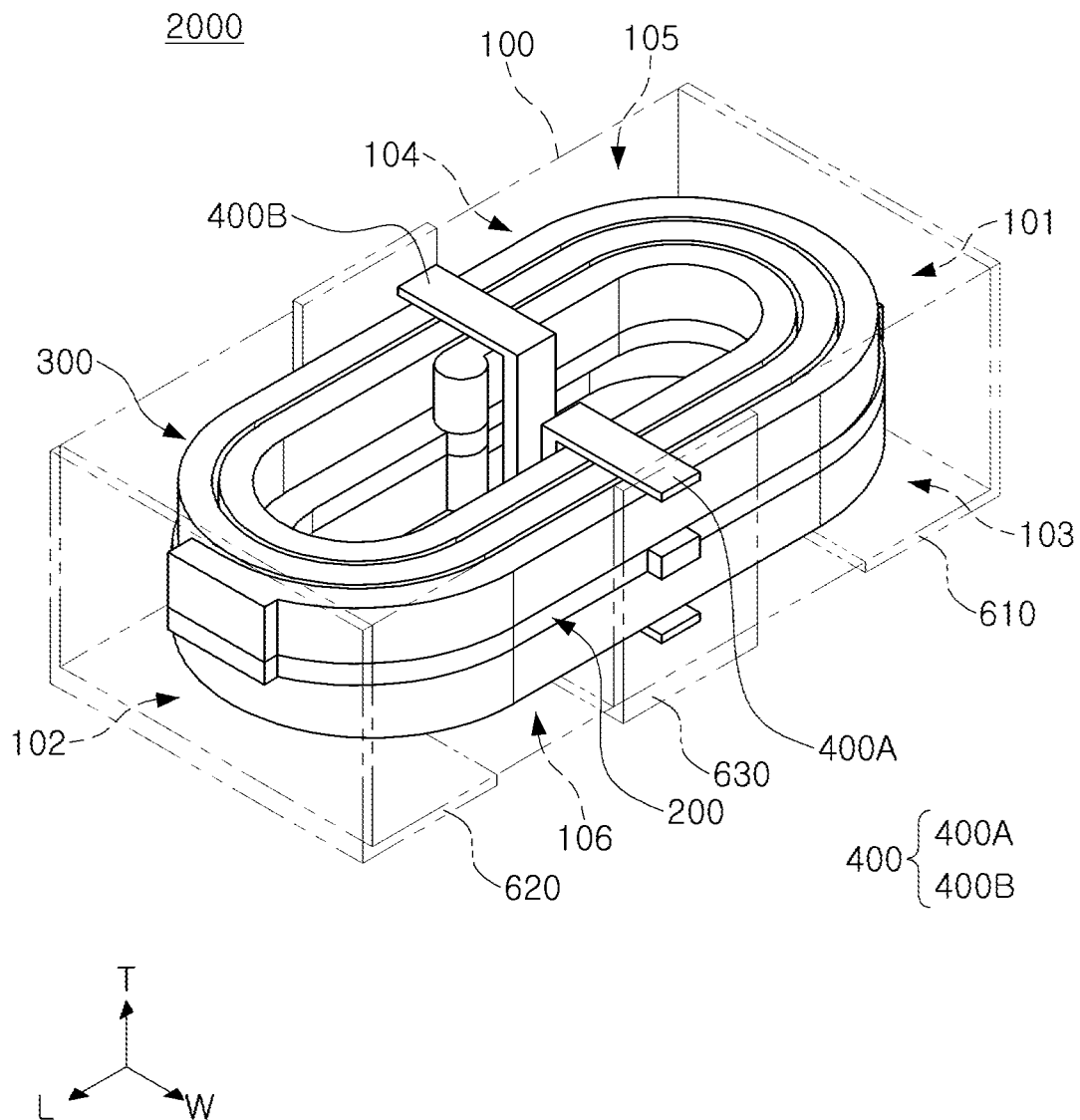
FIG. 8 is a schematic view of a coil component according to a second embodiment of the present disclosure.
Figure 9:
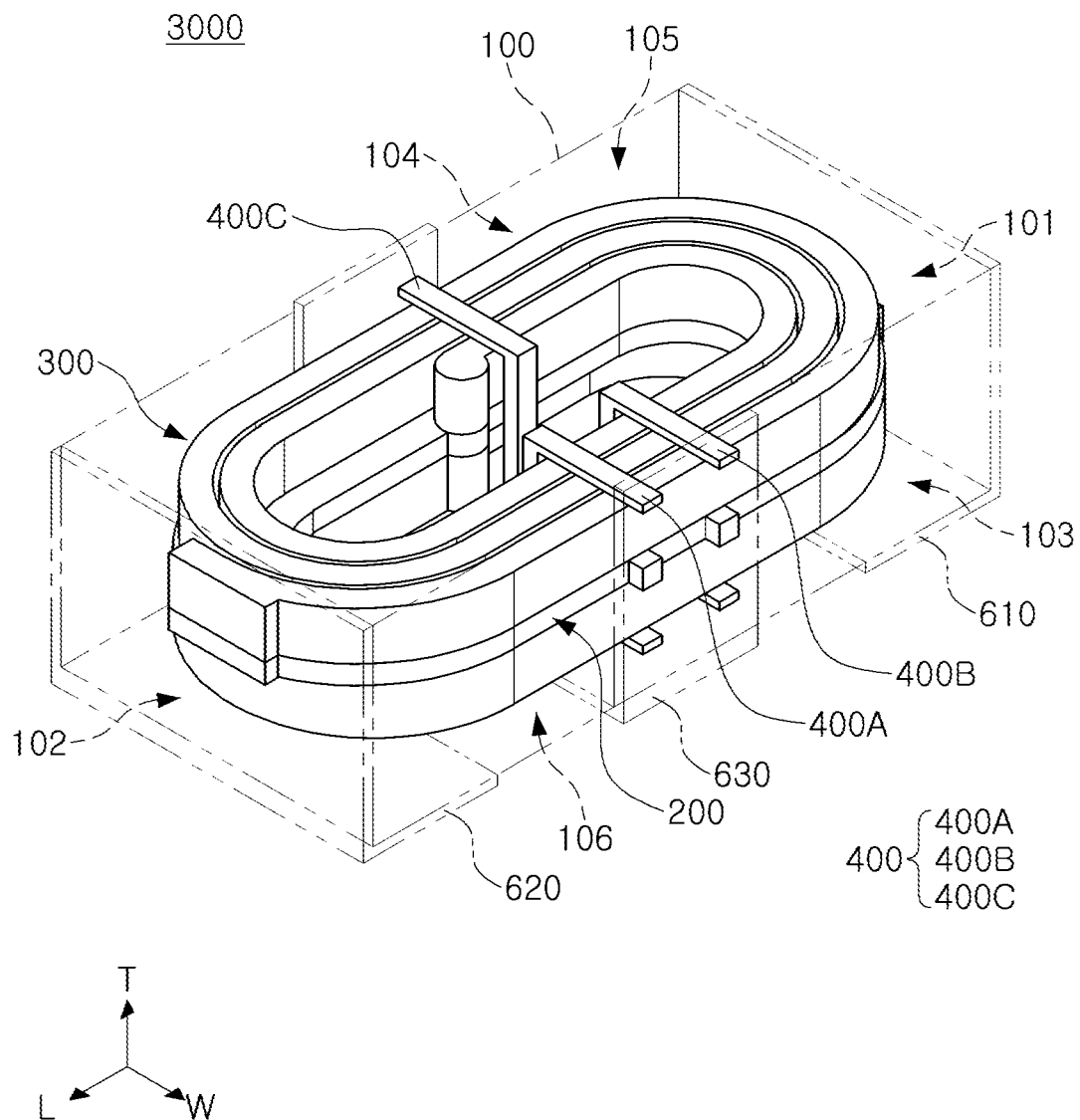
FIG. 9 is a schematic view of a coil component according to a third embodiment of the present disclosure.
Figure 10:
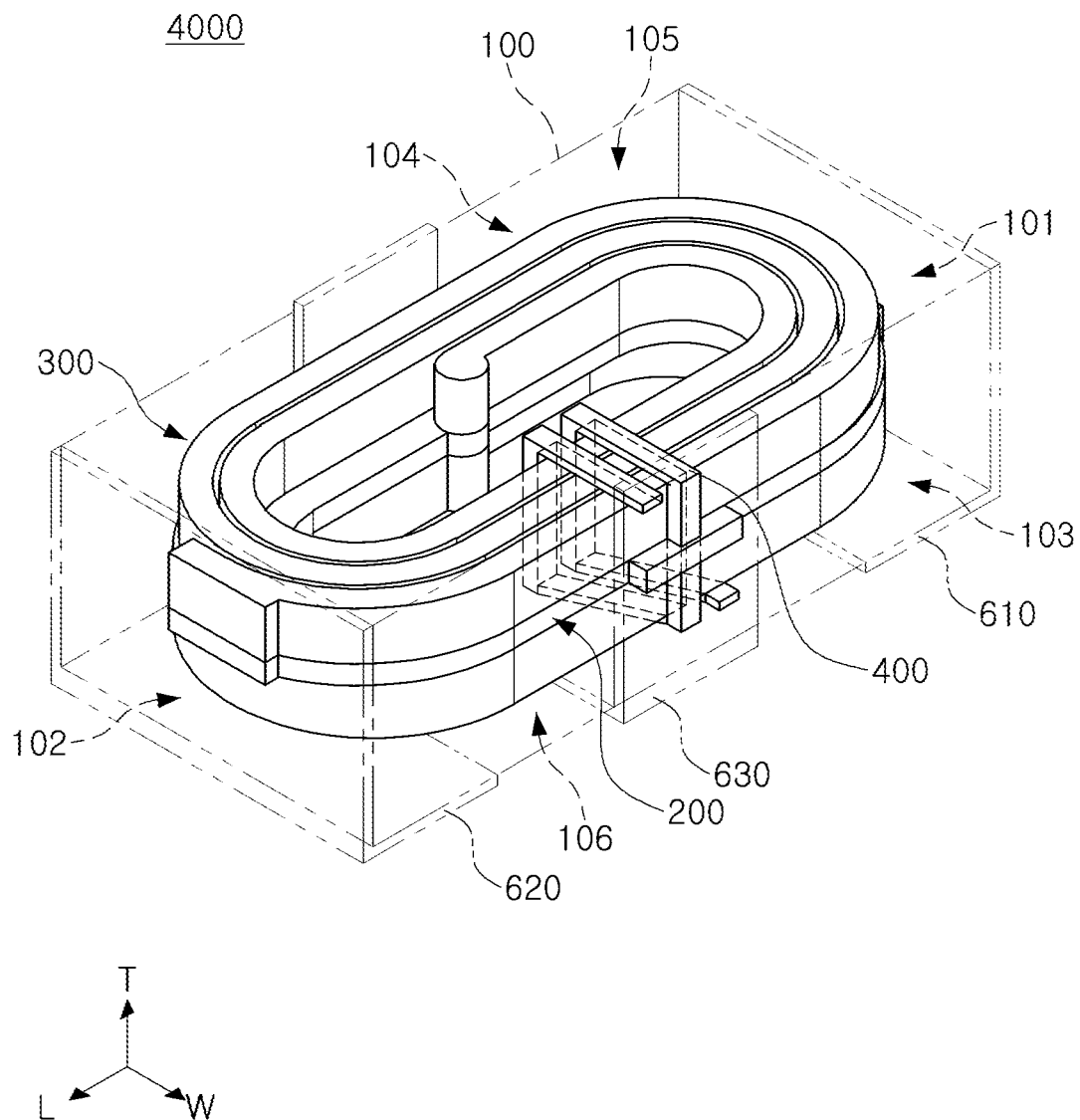
FIG. 10 is a schematic view of a coil component according to a fourth embodiment of the present disclosure.

FIG. 8 is a schematic view of a coil component according to a second embodiment of the present disclosure. FIG. 9 is a schematic view of a coil component according to a third embodiment of the present disclosure. FIG. 10 is a schematic view of a coil component according to a fourth embodiment of the present disclosure.

When comparing FIGS. 1 and 2 with FIGS. 8 to 10, a difference of each of coil components 2000, 3000, and 4000 according to the second, third, and fourth embodiments from the coil component 1000 according to the first embodiment lies in a structure of a noise removal portion 400. Therefore, a description of each of the second, third, and fourth embodiments will focus on only the structure of the noise removal portion 300. The description of each of the first embodiment and the modified embodiments thereof will be applied to the description of the other configurations of each of the second, third, and fourth embodiments as it is.

Referring to FIGS. 8 and 9, a noise removal portion 400 applied to coil components 2000 and 3000 according to the second and third embodiments may be disposed to at least partially surround a coil portion 300 and may include first and second noise removal portions 400A, 400B, and 400C spaced apart from each other between a surface and a core 110 of the body 100. Both end portions of each of the first and second noise removal portions 400A, 400B, and 400C may be connected to a third external electrode 630.

The noise removal portion 400 applied to the coil component 2000 according to the second embodiment may include a first noise removal portion 400A, disposed between a third surface 103 and the core 110 of the body 100, and a second noise removing portion 400B disposed between the core 110 and a fourth surface 104 of the body 100.

Unlike the coil component 2000 according to the second embodiment, the coil component 3000 according to the third embodiment may include a plurality of first noise removal portions 400A and 400C spaced apart from each other between a third surface 103 and a core 110 of a body 100.

Referring to FIG. 10, a noise removal portion 400 applied to the coil component 4000 according to the fourth embodiment may surround a coil portion 300 and may have a shape of a coil forming at least one turn.

As described above, according to exemplary embodiments, radio-frequency (RF) noise may be easily removed.

While exemplary embodiments have been shown and described above, it will be apparent to those skilled in the art that modifications and variations could be made without departing from the scope of the present disclosure as defined by the appended claims.

What is claimed is:

1. A coil component comprising:
a body including a core;
a coil portion disposed in the body and having a central portion in which the core is disposed;

a first external electrode and a second external electrode, each connected to the coil portion;
a third external electrode spaced apart from each of the first and second external electrodes; and
a noise removal portion disposed to at least partially surround the coil portion and having both end portions, each connected to the third external electrode,
wherein at least a portion of the noise removal portion is disposed between the core and the coil portion and extends in a direction orthogonal to a plane of the coil portion.

2. The coil component of claim 1, wherein the noise removal portion comprises a first noise removal portion and a second noise removal portion, spaced apart from each other between the surface and the core of the body, each disposed to at least partially surround the coil portion, and
each of the first and second removal portions has both end portions connected to the third external electrode.

3. The coil component of claim 2, wherein the body has a first surface and a second surface, opposing each other, and a first side surface and a second side surface, each connecting the first surface and the second surface to each other, opposing each other, and
the first and second noise removal portions are disposed to be spaced apart from each other between the first side surface and the core.

4. The coil component of claim 2, wherein the body has a first surface and a second surface, opposing each other, and a first side surface and a second side surface, each connecting the one surface and the other surface to each other, opposing each other,
the first noise removal portion is disposed between first side surface and the core, and
the second noise removal portion is disposed between the second side surface and the core.

5. The coil component of claim 4, wherein at least one of the first and second noise removal portions is formed to include a plurality of noise removal portions spaced apart from each other.

6. The coil component of claim 1, further comprising:
a support substrate disposed in the body and having a central portion in which the core is disposed,
wherein the coil portion comprises planar spiral-shaped first and second coil patterns, respectively disposed on a first surface and a second surface of the support substrate opposing each other, and
wherein the noise removal portion comprises:
a first vertical pattern and a second vertical pattern disposed on the first surface and the second surface of the support substrate to be closer to the core than to an innermost turn of each of the first and second coil patterns;
a first horizontal pattern at least partially surrounding the first coil pattern and connected to each of the first vertical pattern and the third external electrode; and
a second horizontal pattern at least partially surrounding the second coil pattern and connected to each of the second vertical pattern and the third external electrode.

7. The coil component of claim 6, wherein the noise removal portion further comprises a first connection via penetrating through the support substrate to connect the first and second vertical patterns, respectively disposed on the first surface and the second surface of the support substrate, to each other.

8. The coil component of claim 7, further comprising:
an internal insulating layer disposed between each of the first and second coil patterns and the body and between an innermost turn of each of the first and second coil patterns and each of the first and second vertical patterns,
wherein the noise removal portion further comprises a second connection via and a third connection via penetrating through the internal insulating layer to connect each of the first and second horizontal patterns and the first and second vertical patterns to each other.

9. The coil component of claim 8, wherein the internal insulating layer covers a space between adjacent turns of each of the first and second coil patterns, a space between an innermost turn of each of the first and second coil patterns and each of the first and second vertical patterns, an external side surface of an outermost turn of each of the first and second coil patterns, and an upper surface of each of the first and second coil patterns.

10. The coil component of claim 9, wherein the internal insulating layer comprises:
a first internal insulating layer covering the space between the adjacent turns of each of the first and second coil patterns, the space between the innermost turn of each of the first and second coil patterns and each of the first and second vertical patterns, and the external side surface of each of the first and second coil patterns; and
a second internal insulating layer disposed on the first insulating layer and the first and each of the first and second coil patterns to cover a surface of each of the first and second coil patterns distal to a corresponding surface of the support substrate.

11. The coil component of claim 8, further comprising:
an upper insulating layer disposed on the internal insulating layer to cover each of the first and second horizontal patterns.

12. The coil component of claim 11, wherein the upper insulating layer covers a side surface of the support substrate to be disposed between the core and the support substrate.

13. The coil component of claim 11, wherein the upper insulating layer has a side surface disposed on the same level as a side surface of the support substrate adjacent to the core.

14. The coil component of claim 1, wherein the noise removal portion has a shape of a coil forming at least one turn.

15. A coil component, comprising:
a coil portion having a core disposed through a central portion thereof;
a body encapsulating the coil portion and the core;
a first external electrode and a second external electrode disposed to be spaced apart from each other on a surface of the body and connected respectively to a first end and a second end of the coil portion;
a third external electrode disposed on the body to be spaced apart from the first and second external electrodes; and
a noise removal portion having at least a portion of the noise removal portion disposed between the core and the coil portion and opposing ends connected to the third external electrode such that the noise removal portion and a portion of the third external electrode together form at least one loop surrounding the coil pattern without surrounding the core,
wherein the noise removal portion is insulated from the coil portion and the core.

16. The coil component of claim 15, wherein the at least one loop comprises a vertical portion disposed between the core portion and an innermost turn of the coil portion proximal the central portion thereof, a first horizontal portion disposed between a top surface of the coil portion and an upper surface of the body, and a second horizontal portion disposed between a bottom surface of the coil portion and a lower surface of the body.

17. The coil component of claim 15, further comprising:
a support substrate disposed in the body and having a central portion in which the core is disposed,
wherein the coil portion comprises a first coil pattern disposed on a first surface of the support substrate and having at least one turn around the core, and a second coil patterns disposed on a second surface opposing the first surface of the support substrate and having at least one turn around the core,
wherein the first coil pattern and the second coil pattern are connected by a via penetrating the support substrate.

18. The coil component of claim 17, wherein an end of the first coil pattern is connected to the first external electrode and an end of the second coil pattern is connected to the second external electrode.

19. The coil component of claim 15, further comprising an insulating layer insulating the noise removal portion from the coil portion, the core and the body.

20. The coil component of claim 15, wherein the noise removal portion comprises a first noise removal portion and a second noise removal portion spaced apart from the first noise removal portion, each disposed between the core and a surface of the body that is distal to the core and adjacent to an outermost turn of the coil portion.

21. A circuit, comprising:
a coil component comprising:
a coil portion having a core disposed through a central portion thereof;
a body encapsulating the coil portion and the core;
a first external electrode and a second external electrode disposed to be spaced apart from each other on a surface of the body and connected respectively to a first end and a second end of the coil portion;
a third external electrode disposed on the body to be spaced apart from the first and second external electrodes; and
a noise removal portion disposed inside the body and having opposing ends connected to the third external electrode such that the noise removal portion and a portion of the third external electrode together form at least one loop surrounding the coil pattern without surrounding the core, wherein the noise removal portion is insulated from the coil portion and the core;
a signal transmission path in which the first and second external electrodes are connected; and
a ground terminal to which the third external electrode is connected.

* * * * *